(12) United States Patent
Kuramochi

(10) Patent No.: US 8,193,960 B2
(45) Date of Patent: Jun. 5, 2012

(54) OUTPUT APPARATUS AND TEST APPARATUS

(75) Inventor: Yasuhide Kuramochi, Gunma (JP)

(73) Assignee: Advantest Corporation, Tokyo (JP)

( * ) Notice: Subject to any disclaimer, the term of this patent is extended or adjusted under 35 U.S.C. 154(b) by 197 days.

(21) Appl. No.: 12/703,579

(22) Filed: Feb. 10, 2010

(65) Prior Publication Data

US 2011/0193733 A1    Aug. 11, 2011

(51) Int. Cl.
*H03M 1/66* (2006.01)

(52) U.S. Cl. .......................................... 341/144; 341/150

(58) Field of Classification Search .................. 341/144, 341/150, 135, 153, 122, 120, 118
See application file for complete search history.

(56) References Cited

U.S. PATENT DOCUMENTS

| | | | |
|---|---|---|---|
| 5,021,784 A | 6/1991 | Groeneveld et al. | |
| 6,473,015 B2 | 10/2002 | Andersson | |
| 6,590,515 B1 * | 7/2003 | Dacy et al. | 341/144 |
| 6,967,609 B1 * | 11/2005 | Bicakci et al. | 341/144 |
| 7,978,109 B1 * | 7/2011 | Kuramochi | 341/144 |
| 2006/0077137 A1 * | 4/2006 | Kwon | 345/76 |
| 2007/0126616 A1 * | 6/2007 | Cho et al. | 341/144 |
| 2008/0036637 A1 * | 2/2008 | Kawabe et al. | 341/144 |

FOREIGN PATENT DOCUMENTS

JP    H07-147541 A    6/1995

* cited by examiner

*Primary Examiner* — Peguy Jean Pierre

(74) *Attorney, Agent, or Firm* — Chen Yoshimura LLP

(57) ABSTRACT

Provided is an output apparatus comprising a plurality of current sources; a plurality of holding sections that correspond respectively to the current sources and that each hold a designated voltage that designates a current flowing through the corresponding current source; a setting DAC that sequentially generates the designated voltage to be held by each holding section; and a supply section that sequentially switches a supply of the designated voltage generated by the setting DAC among corresponding holding sections.

16 Claims, 12 Drawing Sheets

OUTPUT APPARATUS AND TEST APPARATUS

BACKGROUND

1. Technical Field

The present invention relates to an output apparatus and a test apparatus.

2. Related Art

A known current output DA conversion apparatus is provided with a plurality of current sources connected in parallel to a plurality of output ends, and switches which current sources are connected to output ends according to data input thereto. This DA conversion apparatus switches the output current by switching current, and can therefore achieve high-speed response.

With this DA conversion apparatus, however, it is difficult to accurately set the current of each of the plurality of current sources, and so precise operation becomes difficult. Furthermore, this DA conversion apparatus may house an AD converter to calibrate the current sources, but this increases the circuit size.

Patent Document 1: Japanese Patent Application Publication No. H07-147541
Patent Document 2: U.S. Pat. No. 6,473,015
Patent Document 3: U.S. Pat. No. 5,021,784

SUMMARY

Therefore, it is an object of an aspect of the innovations herein to provide an output apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, an exemplary output apparatus and test apparatus may include a test apparatus and an output apparatus that comprise a plurality of current sources; a plurality of holding sections that correspond respectively to the current sources and that each hold a designated voltage that designates a current flowing through the corresponding current source; a setting DAC that sequentially generates the designated voltage to be held by each holding section; and a supply section that sequentially switches a supply of the designated voltage generated by the setting DAC among corresponding holding sections.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
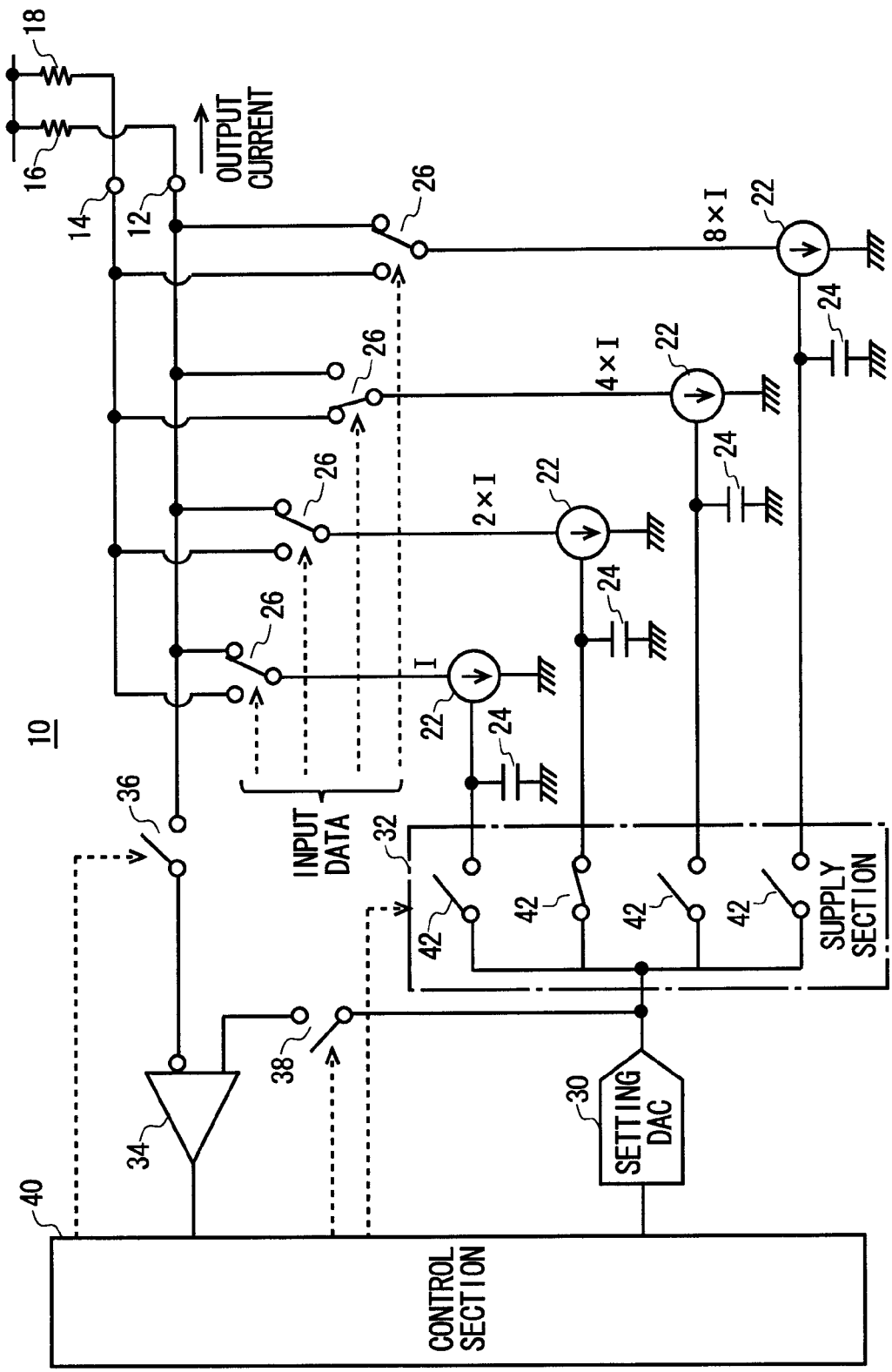
FIG. 1 shows a configuration of a DA conversion apparatus 10 according to an embodiment of the present invention.

FIG. 1 shows a configuration of a DA conversion apparatus 10 according to an embodiment of the present invention. The DA conversion apparatus 10 of the present embodiment causes a current corresponding to input data received from the outside to flow through a first output end 12. The DA conversion apparatus 10 also causes an inverted current, which is inverted around a common current relative to the current flowing through the first output end 12, through a second output end 14.

In the present embodiment, the first output end 12 is connected to a first standard potential, e.g. a power supply potential, via a first resistor 16. The second output end 14 is connected to the first standard potential, e.g. the power supply potential, via a second resistor 18. The DA conversion apparatus 10 of the present embodiment outputs an output voltage corresponding to the input data from each of the first output end 12 and the second output end 14, by causing a current corresponding to the input data to flow through the first output end 12 and the second output end 14. The first resistor 16 and the second resistor 18 may be provided inside the DA conversion apparatus 10 or may be connected externally to the DA conversion apparatus 10.

The DA conversion apparatus 10 includes a plurality of current sources 22, a plurality of holding sections 24, a plurality of switching sections 26, a setting DAC 30, a supply section 32, a comparator 34, a measurement switch 36, a DAC switch 38, and a control section 40.

Each current source 22 is a constant current source that supplies a current corresponding to a designated voltage that is applied to a current setting end. One end of each current source 22 may be connected to a second standard potential, e.g. a ground potential, and the other end of each current source 22 may be connected to the first output end 12 or the second output end 14 via the corresponding switching section 26.

The current sources 22 may be provided to correspond to bits of the input data, and may each supply a current according to the weighting of the corresponding bit. The current sources 22 supply a current that increments in powers of 2, beginning from the current source 22 corresponding to the least significant bit. The current sources 22 may be the same circuits as each other. In this case, the current sources 22 are respectively supplied with designated voltages that differ according to powers of 2.

The holding sections 24 are provided to correspond respectively to the current sources 22. Each holding section 24 holds a designated voltage that designates the current flowing through the corresponding current source 22.

In the present embodiment, each holding section 24 is a capacitor provided between a current setting end of the corresponding current source 22 and the standard potential. Each holding section 24 is charged with the appropriate designated voltage by the setting DAC 30. Each holding section 24 applies the held designated voltage to the current setting end of the corresponding current source 22.

The switching sections 26 are provided to correspond respectively to the current sources 22. Each switching section 26 switches whether the current flowing through the corresponding current source 22 flows to the first output end 12 or to the second output end 14, according to the input data. For example, each switching section 26 may supply the current flowing through the corresponding current source 22 to the first output end 12 if the value of a corresponding bit in the input data is 1, and may supply the current flowing through the corresponding current source 22 to the second output end 14 if the value of the corresponding bit in the input data is 0.

The setting DAC 30 sequentially generates the designated voltages to be held by the holding sections 24, prior to the current output operation of the DA conversion apparatus 10 and as needed during the current output operation. The setting DAC 30 may be a charge redistribution DAC. An exemplary configuration of the setting DAC 30 will be described in detail further below.

The supply section 32 supplies the designated voltages sequentially generated by the setting DAC 30 while sequentially switching to the corresponding holding sections 24. The supply section 32 may include a plurality of transmission switches 42.

The transmission switches 42 are provided to correspond respectively to the current sources 22. Each transmission switch 42 is provided between the voltage generating end of the setting DAC 30 and the corresponding current source 22. When the designated voltage is supplied to any one of the holding sections 24, the transmission switch 42 is connected between the voltage generating end of the setting DAC 30 that generated the designated voltage to be designated for the current source 22 and the current setting end of the corresponding current source 22, and the transmission switches are disconnected between the voltage generating end of the setting DAC 30 and the current setting ends of other current sources 22.

Here, if the setting DAC 30 is a charge redistribution type, each transmission switch 42 is repeatedly connected and disconnected between the voltage generating end of the setting DAC 30 and the current setting end of the corresponding current source 22, thereby causing the designated voltage generated by the setting DAC 30 to charge the holding sections 24, such that the voltages of the holding sections 24 sequentially approach the designated voltages. As a result, each transmission switch 42 can supply the designated voltage generated by the setting DAC 30 to the corresponding holding section 24. An exemplary process performed by a charge redistribution setting DAC 30 for holding designated voltages in a plurality of holding sections 24 is described in detail further below.

During calibration, the comparator 34 compares the voltage generated by the setting DAC 30 to the voltage of the first output end 12. Instead, the comparator 34 may compare the voltage generated by the setting DAC 30 to the voltage of the second output end 14.

The measurement switch 36 is provided between one input end of the comparator 34 and the first output end 12. The measurement switch 36 is connected between the one input end of the comparator 34 and the first output end 12 during calibration, and is disconnected between the one input end of the comparator 34 and the first output end 12 during the current output operation. When the comparator 34 compares the voltage generated by the setting DAC 30 to the voltage of the second output end 14, the measurement switch 36 is provided between the one input end of the comparator 34 and the second output end 14.

The DAC switch 38 is provided between the other input end of the comparator 34, which is the input end that the first output end 12 is not connected to, and the voltage generating end of the setting DAC 30. The DAC switch 38 is connected between the other input end of the comparator 34 and the voltage generating end of the setting DAC 30 during calibration, and is disconnected between the other input end of the comparator 34 and the voltage generating end of the setting DAC 30 during the current output operation.

During calibration, the control section 40 adjusts the designated voltage supplied to each holding section 24 by the setting DAC 30, based on the result of the comparison between the voltage generated by the setting DAC 30 and the voltage corresponding to the current flowing through the current sources 22.

More specifically, the control section 40 first selects a current source 22 to be adjusted from among the plurality of current sources 22. Next, the control section 40 measures the voltage corresponding to the current flowing through the selected current source 22 under adjustment, based on the result of the comparison by the comparator 34 between the voltage generated by the setting DAC 30 and the voltage corresponding to the current flowing through the current source 22 under adjustment.

For example, the control section 40 measures the voltage of the first output end 12 when the first resistor 16 is connected, or the voltage of the second output end 14 when the second resistor 18 is connected, using a sequential comparison process performed by the comparator 34 and the setting DAC 30. The control section 40 then adjusts the designated voltage supplied to the current source 22 under adjustment based on the measurement results, such that the current flowing through the current source 22 under adjustment becomes a predetermined target value.

The DA conversion apparatus 10 of the present embodiment causes current to flow through the output ends by switching the current flowing through the current sources 22, and can therefore output a current corresponding to the input data that can respond quickly. Furthermore, the DA conversion apparatus 10 measures the current flowing through the current sources 22 and adjusts this current to match a target value, and can therefore accurately output a current corresponding to the input data. Yet further, the DA conversion apparatus 10 supplies the designated voltage that designates the current flowing through each current source 22 by having a single setting DAC 30 perform sequential switching, and can therefore accurately output the current while having a simple configuration.

The setting DAC 30, the comparator 34, and the control section 40 may be shared by a plurality of current output DA conversion apparatuses. Furthermore, the setting DAC 30, the comparator 34, and the control section 40 may be provided to output apparatuses other than current output DA conversion apparatuses, such as current drivers, as long as these apparatuses are provided with a plurality of current sources 22 and a plurality of holding sections 24.

Figure 2:
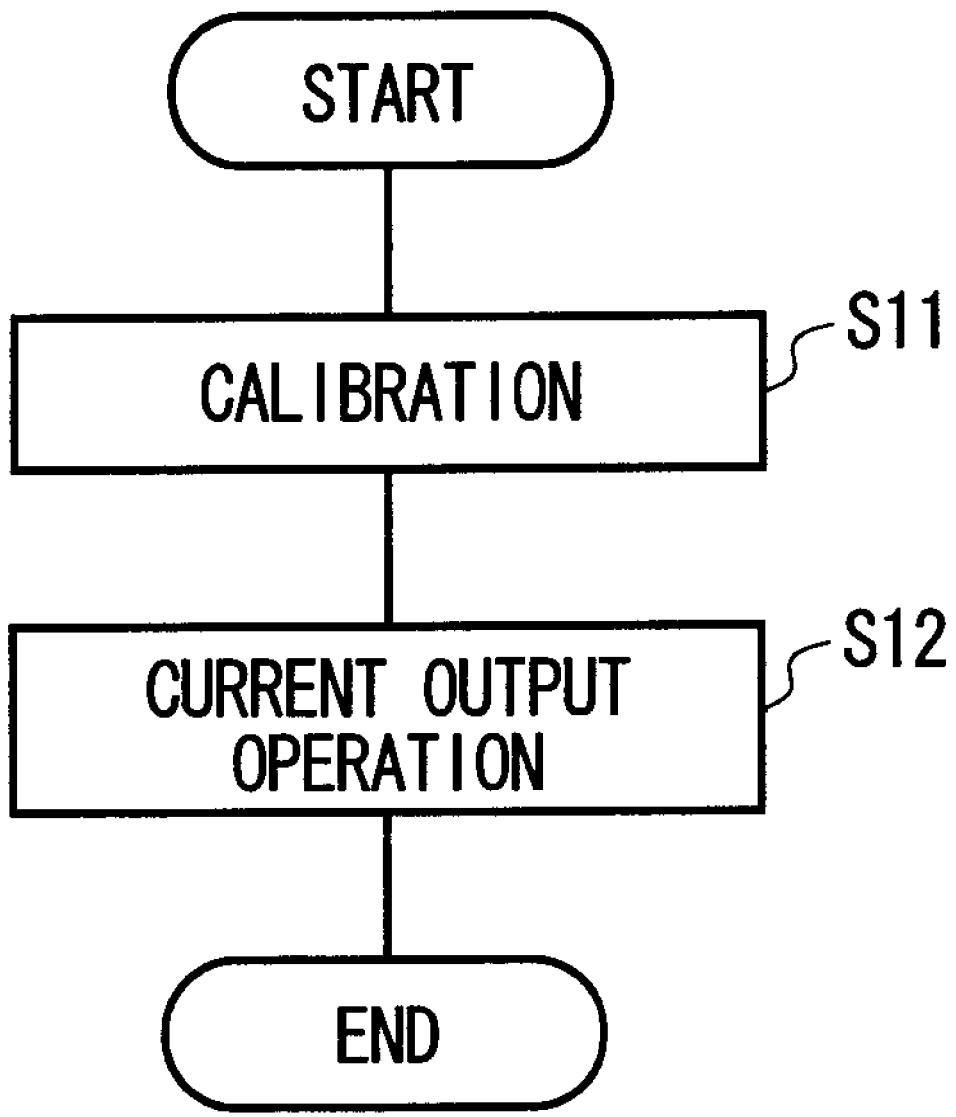
FIG. 2 is a flow chart showing a process performed by the DA conversion apparatus 10 of the present embodiment.

FIG. 2 is a flow chart showing a process performed by the DA conversion apparatus 10 of the present embodiment. Prior to the current output operation, the DA conversion apparatus 10 performs a calibration to measure the voltages of the output ends (S11). The DA conversion apparatus 10 may perform the calibration after the power is turned on or immediately after being reset, or may perform the calibration periodically.

After calibration, the DA conversion apparatus 10 performs the current output operation (S12). During the current output operation, the DA conversion apparatus 10 causes currents corresponding to input data received from the outside to flow through the output ends.

Figure 3:
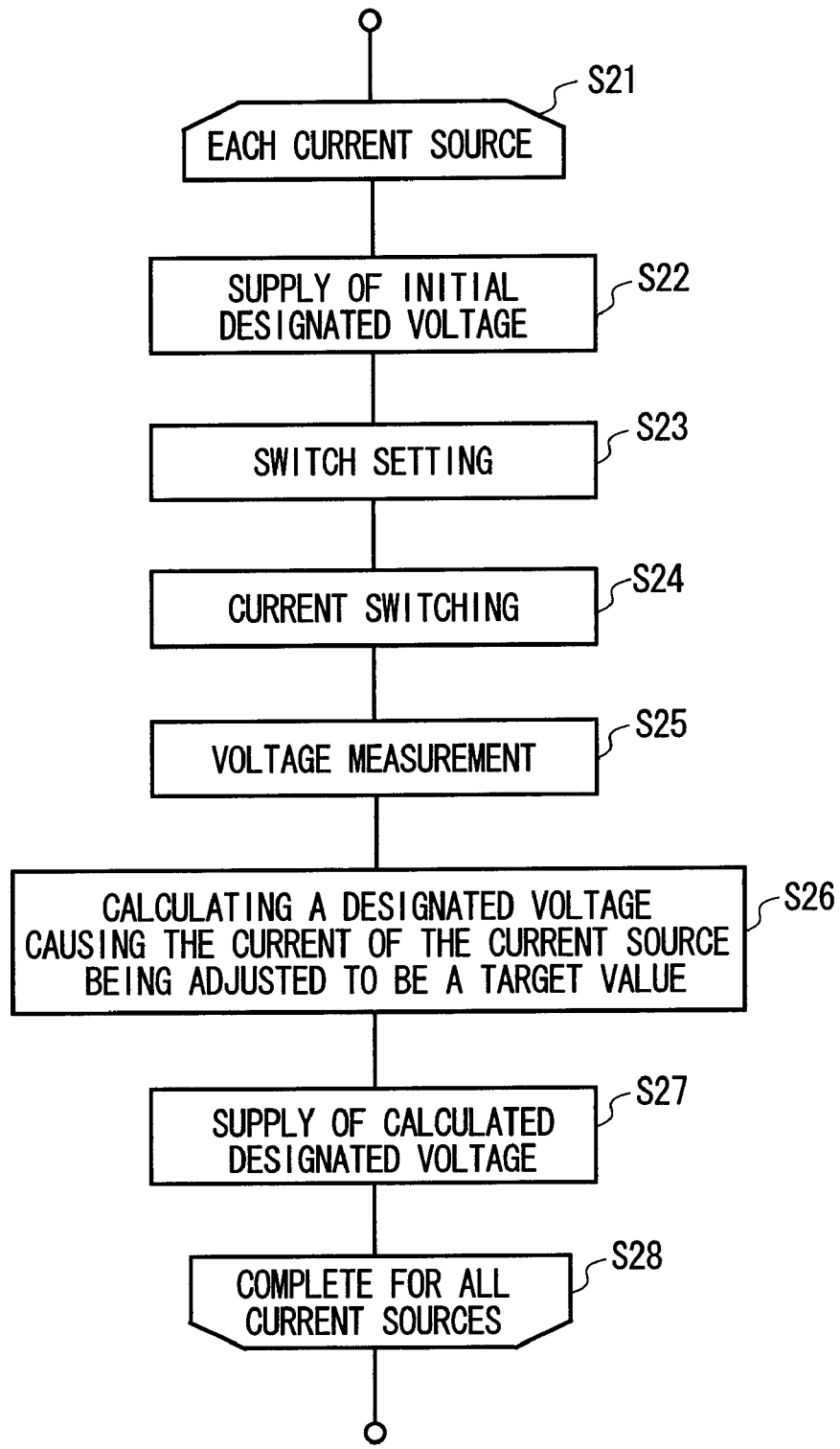
FIG. 3 is a flow chart showing the process of step S11 in FIG. 2 in detail.

FIG. 3 is a flow chart showing the process of step S11 in FIG. 2 in detail. During calibration, the DA conversion apparatus 10 performs the processes from step S22 to step S27 for each current source 22 (the process loop from S21 to S28).

First, the control section 40 charges the holding section 24 corresponding to the current source 22 under adjustment with an initial designated voltage, and the holding section 24 holds this voltage (S22). Specifically, the control section 40 causes the setting DAC 30 to generate the initial designated voltage to be supplied to the current source 22 under adjustment, and controls the supply section 32 to apply the voltage generated by the setting DAC 30 to the holding section 24 corresponding to the current source 22 under adjustment.

In this way, the control section 40 can charge the holding section 24 corresponding to the current source 22 under adjustment with the initial designated voltage, and cause the holding section 24 to hold this voltage. The initial designated voltage may be set in advance by a user or the like, or may be supplied by the most recent calibration if a calibration has been performed. An exemplary operation of the setting DAC 30 and the supply section 32 when charging the holding section 24 with this voltage is described in FIGS. 5 to 8.

Next, the control section 40 switches the transmission switches 42 in the supply section 32, the measurement switch 36, and the DAC switch 38 (S23). Specifically, the control section 40 controls the transmission switches 42 in the supply section 32 to be disconnected between the voltage output end of the setting DAC 30 and the respective current sources 22. The control section 40 controls the measurement switch 36 to be connected between the first output end 12 and the comparator 34. The control section 40 controls the DAC switch 38 to be connected between the voltage generating end 50 of the setting DAC 30 and the comparator 34.

Next, the control section 40 switches the switching sections 26 such that the current of the current source 22 under adjustment flows to the first output end 12 and the currents of the current sources 22 that are not under adjustment do not flow to the first output end 12 (S24). Specifically, the control section 40 switches the switching section 26 corresponding to the current source 22 under adjustment to the first output end 12 side and switches the switching sections 26 corresponding to the current sources 22 that are not under adjustment to the second output end 14 side.

The control section 40 then controls the comparator 34 and the setting DAC 30 to measure the voltage of the first output end 12 using a sequential comparison process (S25). Specifically, the control section 40 changes the voltage generated by the setting DAC 30 by sequentially changing the comparison data supplied to the setting DAC 30. The control section 40 then identifies comparison data that causes the voltage output by the setting DAC 30 and the voltage of the first output end 12 to be approximately equal, based on the comparison results from the comparator 34 between the sequentially changing voltage generated by the setting DAC 30 and the voltage of the first output end 12. In this way, the control section 40 can measure the voltage of the first output end 12.

In the sequential comparison process, the control section 40 changes the comparison data supplied to the setting DAC 30 according to a binary search based on the comparison results from the comparator 34. As a result, the control section 40 can quickly identify comparison data that causes the voltage output by the setting DAC 30 and the voltage of the first output end 12 to be approximately equal.

Next, the control section 40 calculates a designated voltage that causes the current flowing through the current source 22 under adjustment to be the predetermined target value, based on the initial designated voltage charged in the holding section 24 corresponding to the current source 22 under adjustment in step S22 and the voltage of the first output end 12 measured in step S25 (S26). For example, the control section 40 may calculate the current flowing through the first output end 12 when the initial designated voltage is supplied to the current source 22, based on the voltage of the first output end 12 measured in step S25. The control section 40 may then calculate the designated voltage that causes the current flowing through the current source 22 under adjustment to be the target value, based on a ratio between the calculated current and the initial designated voltage. The control section 40 may hold the value of the designated voltage calculated in this way in a memory as the value of the designated voltage to be supplied to the holding section 24 corresponding to the current source 22 under adjustment.

Next, the control section 40 charges the holding section 24 corresponding to the current source 22 under adjustment with the designated voltage that causes the current flowing through the current source 22 under adjustment to be the target value, and causes the holding section 24 to hold this voltage (S27). The operation of the setting DAC 30 and the supply section 32 when charging the holding section 24 with this voltage is the same as the process described in step S22, and a detailed example of this operation is provided in FIGS. 5 to 8.

Through the process described above, the control section 40 can adjust the designated voltage to be supplied to the current source 22 under adjustment that causes the current flowing through the current source 22 under adjustment to be the predetermined target value based on the measurement results of the voltage of the first output end 12. The control section 40 performs this process from step S22 to S27 for each of the current sources 22. As a result, the control section 40 can cause the current flowing through each current source 22 to match a target value.

The control section 40 may repeat the process from step S22 to step S27 several times for a single current source 22. In this case, the control section 40 does not perform step S22 from the second time onward. As a result, the control section 40 can more accurately match the current flowing through the current source 22 under adjustment to the target value by asymptotically bringing this current closer to the target value.

Figure 4:
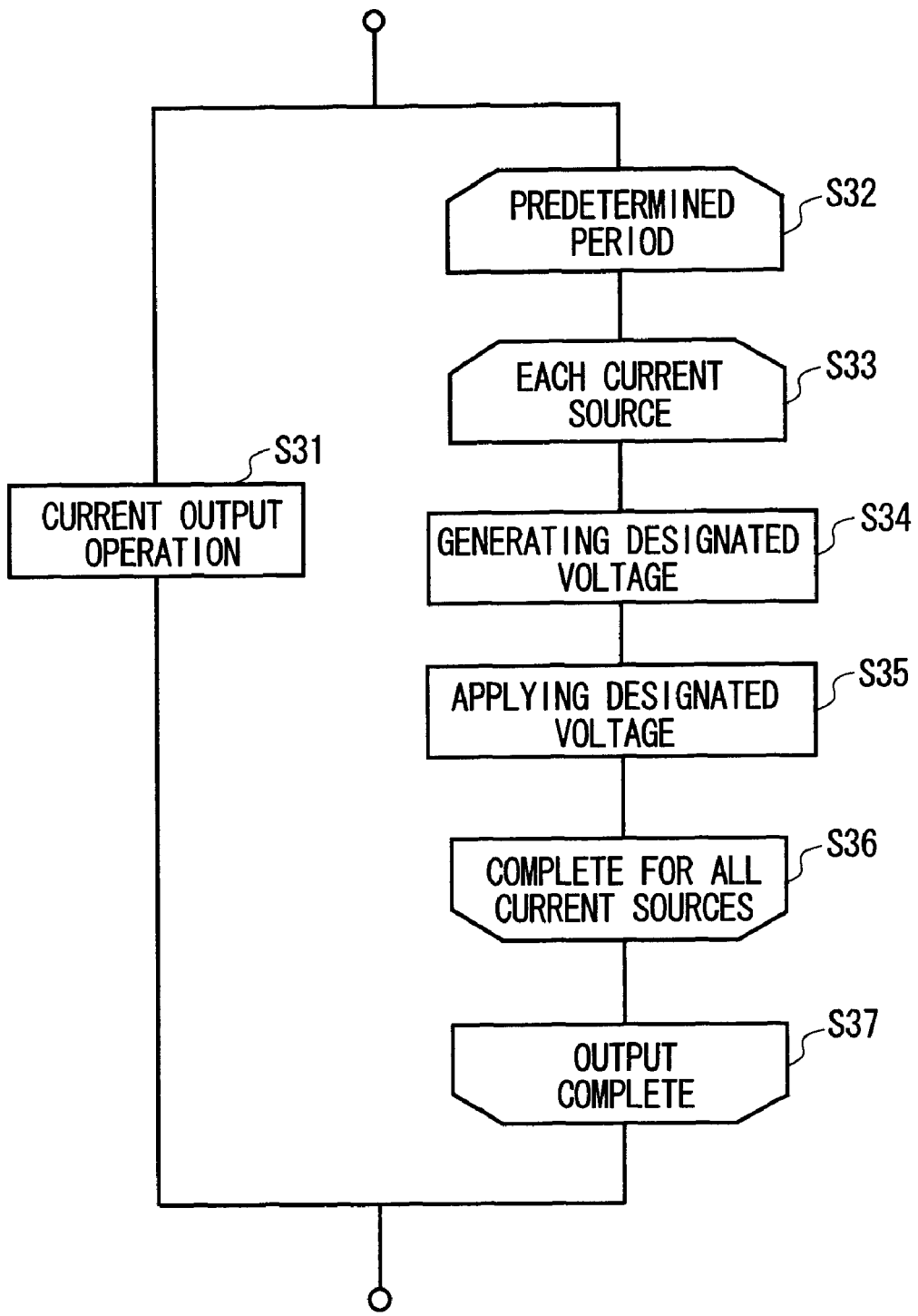
FIG. 4 is a flow chart showing the process of step 12 of FIG. 2 in detail.

FIG. 4 is a flow chart showing the process of step 12 of FIG. 2 in detail. Upon receiving an operation initiation command from a user or the like, the DA conversion apparatus 10 performs the current output operation (S31). During the current output operation, the DA conversion apparatus 10 causes a current corresponding to the input data received from the outside to flow to the first output end 12 by switching the switching sections 26 according to the input data.

In parallel with the current output operation (S31), the DA conversion apparatus 10 repeats the process for supplying the designated voltage to the holding sections 24 for each of a plurality of prescribed periods (the process loop from S32 to S37). For example, the control section 40 may perform the process of supplying the designated voltage for each prescribed period, which is a period shorter than a period during which the designated voltages held by the holding sections 24 decrease a prescribed amount due to discharge, e.g. the time it takes for the designated voltage to drop below a predetermined ratio.

In the process of supplying the designated voltage, the control section 40 repeats the process of step S34 and step S35 for each current source 22 (the process loop from S33 to S36).

In step S34, the control section 40 causes the setting DAC 30 to generate a designated voltage corresponding to the selected current source 22, which is the designated voltage adjusted during calibration. Then, in step S35, the control section 40 controls the supply section 32 to apply the designated voltage generated by the setting DAC 30 to the holding section 24 corresponding to the selected current source 22. As a result, the holding section 24 corresponding to the selected current source 22 is charged with the designated voltage, and so a current that accurately matches the target value flows from the selected current source 22.

The control section 40 performs step S34 and step S35 sequentially for the plurality of current sources 22. The operation of the setting DAC 30 and the supply section 32 when charging the holding section 24 with this voltage is the same as the process described in step S22, and a detailed example of this operation is provided in FIGS. 5 to 8.

In the manner described above, the control section 40 can sequentially supply each holding section 24 with a designated voltage that designates the current flowing through the corresponding current source 22. Furthermore, the control section 40 can replenish the voltage of each holding section 24 before the designated voltage held by the holding section 24 decreases beyond a prescribed amount. As a result, the control section 40 can cause a current matching the target value to constantly flow from the current sources 22.

During the current output operation, the control section 40 may measure the voltage of the output end 12 at a timing when the current from only one of the current sources 22 is flowing through the first output end 12. For example, the control section 40 may measure the voltage of the first output end 12 at a timing when input data is received in which only one bit has a value of 1 and all other bits have a value of 0. As a result, the control section 40 can perform the calibration even during the current output operation.

Figure 5:
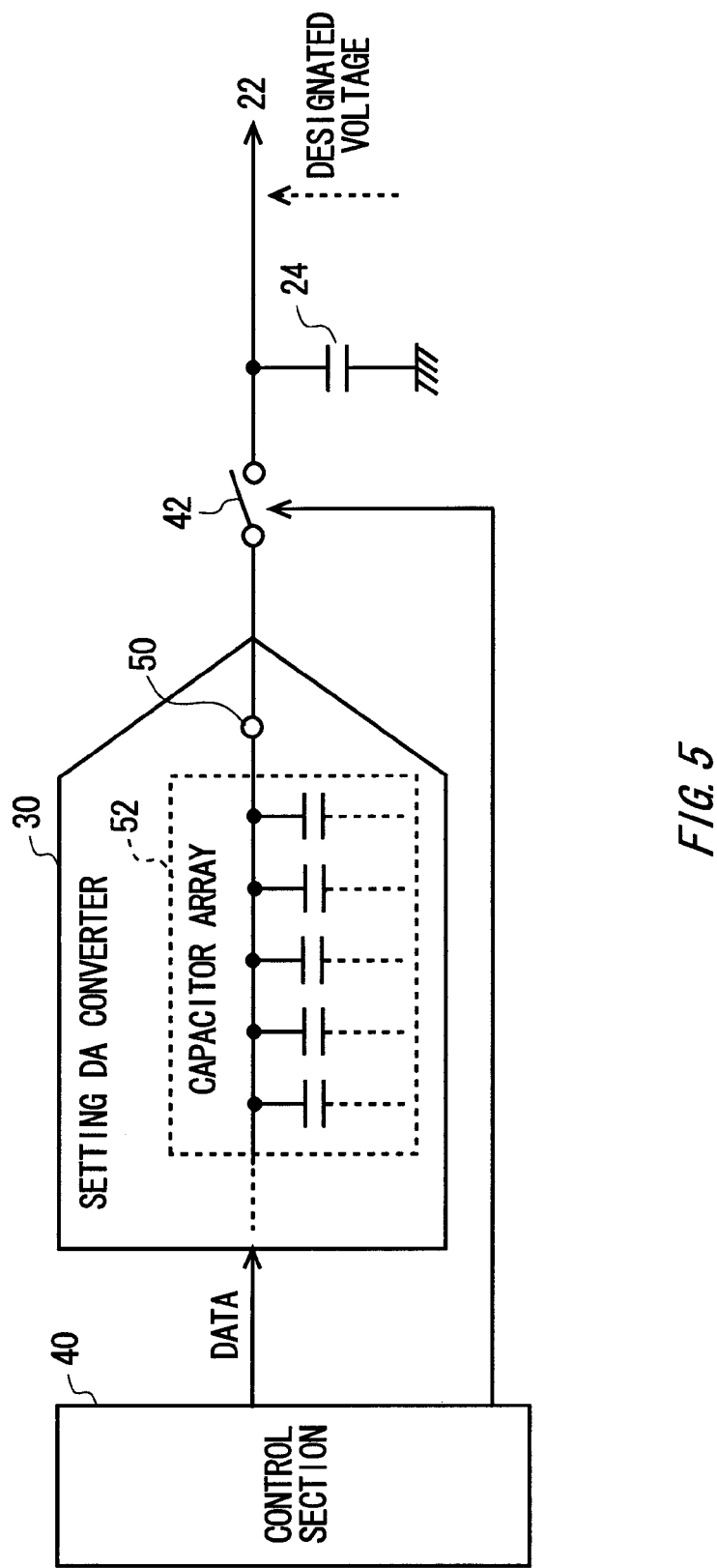
FIG. 5 shows the setting DAC 30, the control section 40, one holding section 24, and one transmission switch 42 according to the present embodiment.

FIG. 5 shows the setting DAC 30, the control section 40, one holding section 24, and one transmission switch 42 according to the present embodiment. In the present embodiment, the setting DAC 30 is a charge redistribution DA converter that includes a capacitor array 52. When outputting a voltage corresponding to input data from the control section 40, this setting DAC 30 operates in (i) a refresh mode that involves accumulating a charge corresponding to a reference voltage in the capacitor array 52 and (ii) an output mode that involves switching the connection arrangement in the capacitor array 52, in which the reference voltage is accumulated, according to the input data and generating a voltage according to the input data from the voltage generating end 50.

When charging the holding sections 24 with the designated voltage and causing the holding sections 24 to hold this voltage, the control section 40 causes the setting DAC 30 to alternately perform the operation of the refresh mode and the operation of the output mode. As a result, the control section 40 causes the setting DAC 30 to repeatedly generate the designated voltage from the voltage generating end 50.

In addition, the control section 40 repeatedly switches, between connected and disconnected states, the transmission switch 42 provided between the holding section 24 to which the designated voltage is to be supplied and the voltage generating end 50 of the setting DAC 30. More specifically, the control section 40 connects the transmission switch 42 during at least a portion of the period of the output mode, and disconnects the transmission switch 42 at other times. For example, the control section 40 may connect the transmission switch 42 during the output mode and disconnect the transmission switch 24 during the refresh mode. In such a case, the control section 40 may switch the transmission switch in synchronization with the refresh mode and the output mode of the setting DAC 30.

Here, the capacitor array 52 in the setting DAC 30 is connected directly to the voltage generating end 50 of the setting DAC 30 without a buffer or the like therebetween. Accordingly, when the setting DAC 30 connects the transmission switch 42 during the output mode, charge moves between the holding section 24 and the capacitor array 52 in the setting DAC 30, such that the voltage generated from the voltage generating end 50 and the voltage of the holding section 24 become equal.

For example, if the voltage generated from the voltage generating end 50 is higher than the voltage of the holding section 24 when the setting DAC 30 is in the output mode and the transmission switch 42 is disconnected, the transmission switch 42 is connected to lower the voltage of the voltage generating end 50, which increases the voltage of the holding section 24. On the other hand, if the voltage generated from the voltage generating end 50 is lower than the voltage of the holding section 24 when the setting DAC 30 is in the output mode and the transmission switch 42 is disconnected, the transmission switch 42 is connected to increase the voltage of the voltage generating end 50, which lowers the voltage of the holding section 24.

Accordingly, the control section 40 causes the setting DAC 30 to alternate between the refresh mode and the output mode to repeatedly generate the designated voltage, and also connects the transmission switch 42 during the output mode to gradually increase or decrease the voltage of the holding section 24, thereby generating the designated voltage. In this way, the control section 40 causes the setting DAC 30 to charge the holding section 24 with the designated voltage by alternately connecting and disconnecting the transmission switch 42, and thereby causes the voltage of the holding section 24 to gradually approach the designated voltage.

Figure 6:
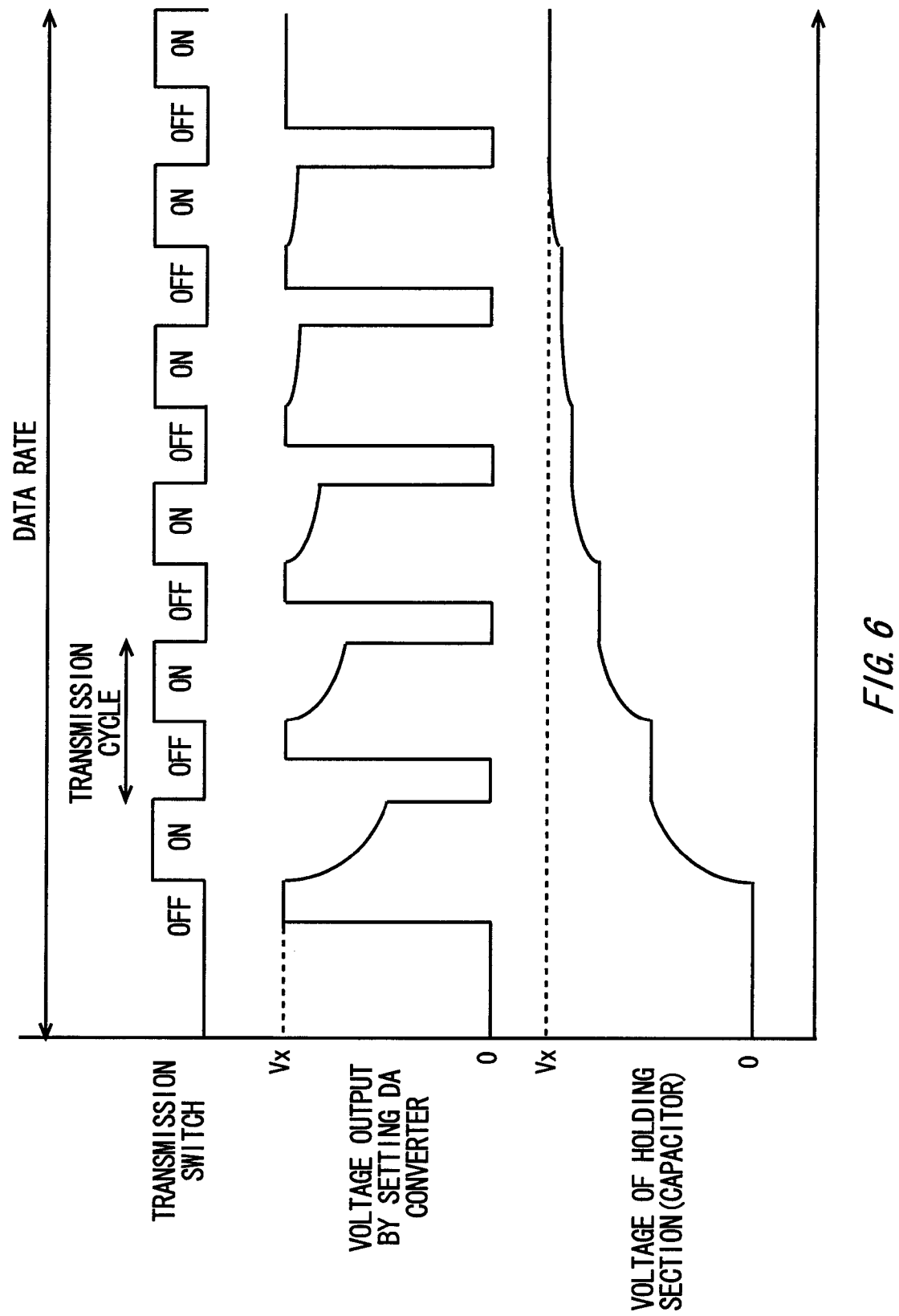
FIG. 6 shows an exemplary voltage waveform of each node and a switching timing of the transmission switch 42 when supplying the holding section 24 with the designated voltage.

FIG. 6 shows an exemplary voltage waveform of each node and a switching timing of the transmission switch 42 when supplying the holding section 24 with the designated voltage. First, the control section 40 turns the transmission switch 42 OFF. During the period in which the transmission switch 42 is OFF, the setting DAC 30 performs the operation of the refresh mode and then performs the operation of the output mode to generate the designated voltage Vx. The setting DAC 30 generates a common potential during the refresh mode.

Accordingly, while the transmission switch 42 is OFF, the voltage generating end 50 of the setting DAC 30 first becomes the common potential, and then becomes the designated voltage Vx. In FIG. 6, the common potential is 0 V.

Next, the control section 40 turns the transmission switch 42 ON. During the period in which the transmission switch 42 is ON, the setting DAC 30 continues the operation of the output mode. Accordingly, one of the voltage of the voltage generating end 50 of the setting DAC 30 and the voltage of the holding section 24 increases while the other decreases, such that the two voltages approach each other.

The control section 40 repeatedly turns the transmission switch 42 ON and OFF in this manner. For each repetition of the transmission switch 42 being turned ON and OFF, the potential difference between the holding section 24 and the voltage generating end 50 of the setting DAC 30 when the transmission switch 42 is OFF becomes gradually smaller. Accordingly, the control section 40 can cause the voltage of the holding section 24 to match the designated voltage Vx.

Figure 7:
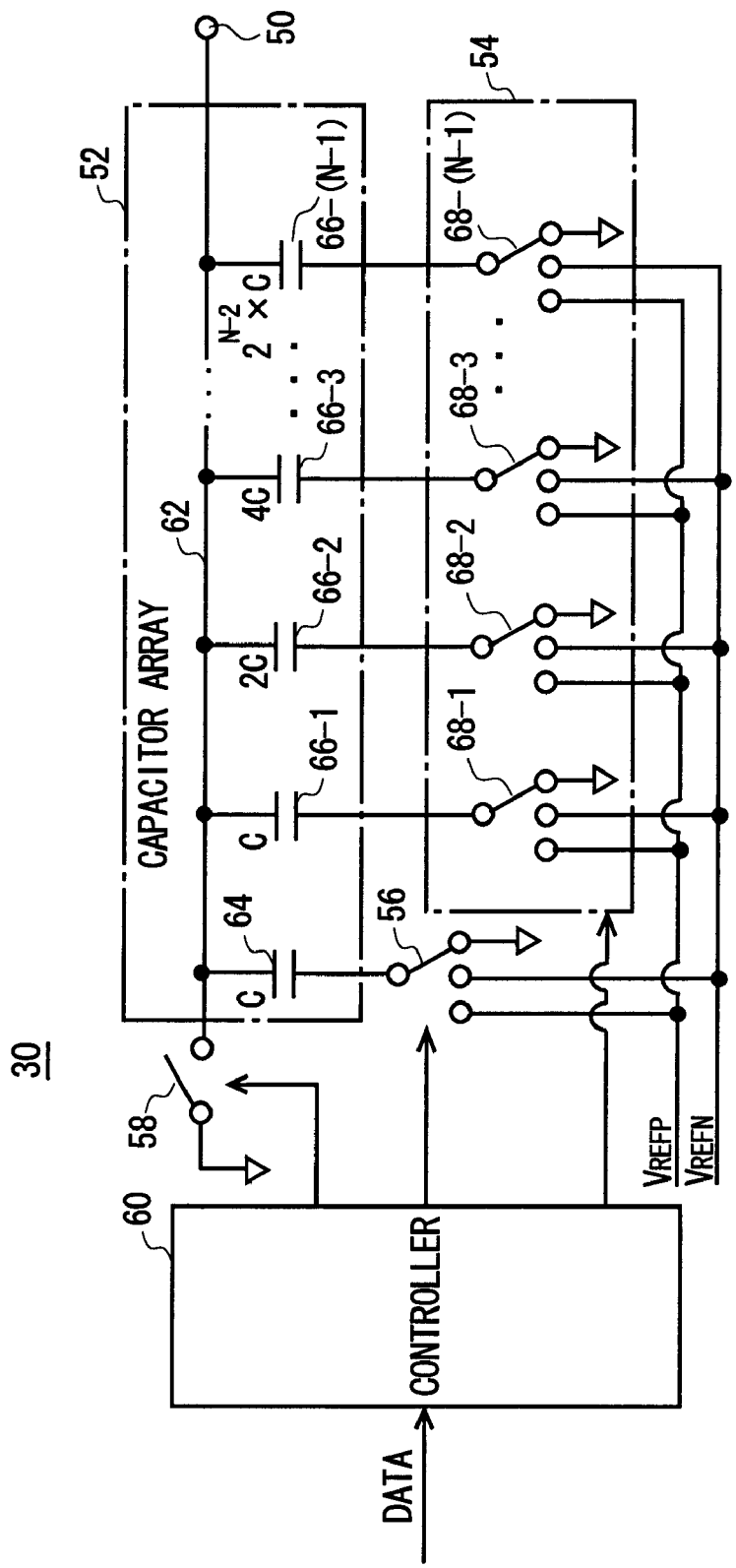
FIG. 7 shows an exemplary configuration of the setting DAC 30 according to the present embodiment.

FIG. 7 shows an exemplary configuration of the setting DAC 30 according to the present embodiment. The setting DAC 30 shown in FIG. 7 generates a voltage corresponding to N-bit data, where N is an integer greater than 2.

The setting DAC 30 includes the capacitor array 52, a DAC internal switching section 54, a dummy switch 56, a refresh switch 58, and a controller 60. The capacitor array 52 is connected to the voltage generating end 50. The capacitor array 52 includes an output line 62, a dummy capacitor 64, and bit capacitors 66-1 to 66-(N−1).

The output line 62 is connected to the voltage generating end 50 without a buffer or the like therebetween. The dummy capacitor 64 has one end thereof connected to the output line 62. The dummy capacitor 64 has a capacitance corresponding to the weighting of a first bit, i.e. least significant bit, of the input data.

Each of the bit capacitors 66-1 to 66-(N−1) has one end thereof connected to the output line 62. Each of the bit capacitors 66-1 to 66-(N−1) corresponds to one of the first to (N−1)th bits of the input data, and has a capacitance according to the weighting of the corresponding bit. For example, if the first bit has a capacitance C, the second bit has a capacitance 2×C, the third bit has a capacitance $2^2$×C, and the (N−1)th bit has a capacitance $2^{(N-2)}$×C.

The DAC internal switching section 54 switches the connections in the capacitor array 52. The DAC internal switching section 54 includes bit switches 68-1 to 68-(N−1). The bit switches 68-1 to 68-(N−1) correspond respectively to the bit capacitors 66-1 to 66-(N−1). Each of the bit switches 68-1 to 68-(N−1) connects the other end of the corresponding bit capacitor 66, which is the end of the bit capacitor 66 not connected to the output line 62, to one of a positive reference potential $V_{REFP}$, a negative reference potential $V_{REFN}$, and a common potential $V_{CM}$.

The dummy switch 56 connects the other end of the dummy capacitor 64, which is the end not connected to the output line 62, to one of the positive reference potential $V_{REFP}$, the negative reference potential $V_{REFN}$, and the common potential $V_{CM}$. The refresh switch 58 switches whether the end of the output line 62 on the side opposite the voltage generating end 50 is connected to the common potential $V_{CM}$. The controller 60 controls the switching of the DAC internal switching section 54, the dummy switch 56, and the refresh switch 58 according to the input data supplied thereto.

Here, the positive reference potential $V_{REFP}$ and the negative reference potential $V_{REFN}$ are voltages with opposite polarities centered on the common potential $V_{CM}$, and both have the same difference relative to the common potential $V_{CM}$. The common potential $V_{CM}$ is represented by the inverted triangle marks in FIG. 7. The common potential $V_{CM}$ may be a ground potential, for example. The setting DAC 30 described above can generate an analog voltage divided with an N-bit resolution between the positive reference potential $V_{REFP}$ and the negative reference potential $V_{REFN}$.

Figure 8:
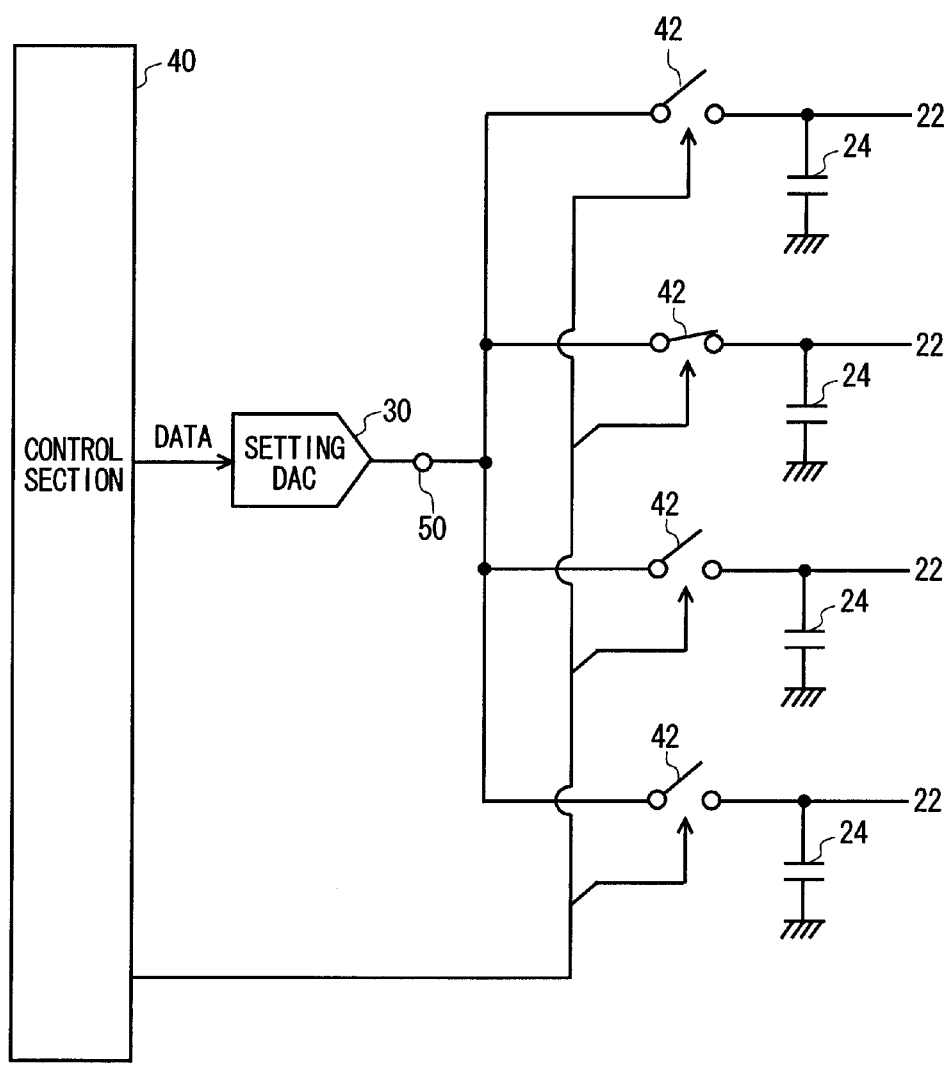
FIG. 8 shows an exemplary connection configuration of the setting DAC 30 and a plurality of transmission switches 42 according to the present embodiment.

FIG. 8 shows an exemplary connection configuration of the setting DAC 30, the control section 40, a plurality of holding sections 24, and a plurality of transmission switches 42 in the DA conversion apparatus 10 according to the present embodiment. In the DA conversion apparatus 10 of the present embodiment, the holding sections 24 are connected in parallel to the voltage generating end 50 of the setting DAC 30. The transmission switches 42 are provided to correspond respectively to the holding sections 24, and are each connected and disconnected between the voltage generating end 50 of the setting DAC 30 and the corresponding holding section 24.

When sequentially supplying the designated voltage to the holding sections 24, the control section 40 sequentially selects one of the current sources 22. The control section 40 then charges the holding section 24 corresponding to the selected current source 22 using the process described in FIGS. 5 and 6. Specifically, the control section 40 repeatedly connects and disconnects the transmission switch 42 corresponding to the selected current source 22, such that the setting DAC 30 charges the holding section 24 corresponding to the selected current source 22 with the designated voltage that designates the current flowing through the selected current source 22, thereby causing the voltage of the holding section 24 corresponding to the selected current source 22 to gradually approach the designated voltage.

In this case, the control section 40 also disconnects the transmission switches 42 corresponding to the current sources 22 that are not selected. As a result, when sequentially supplying the designated voltage to the holding sections 24, the control section 40 avoids applying inappropriate designated voltages to holding sections 24 corresponding to current sources 22 that are not selected.

Figure 9:
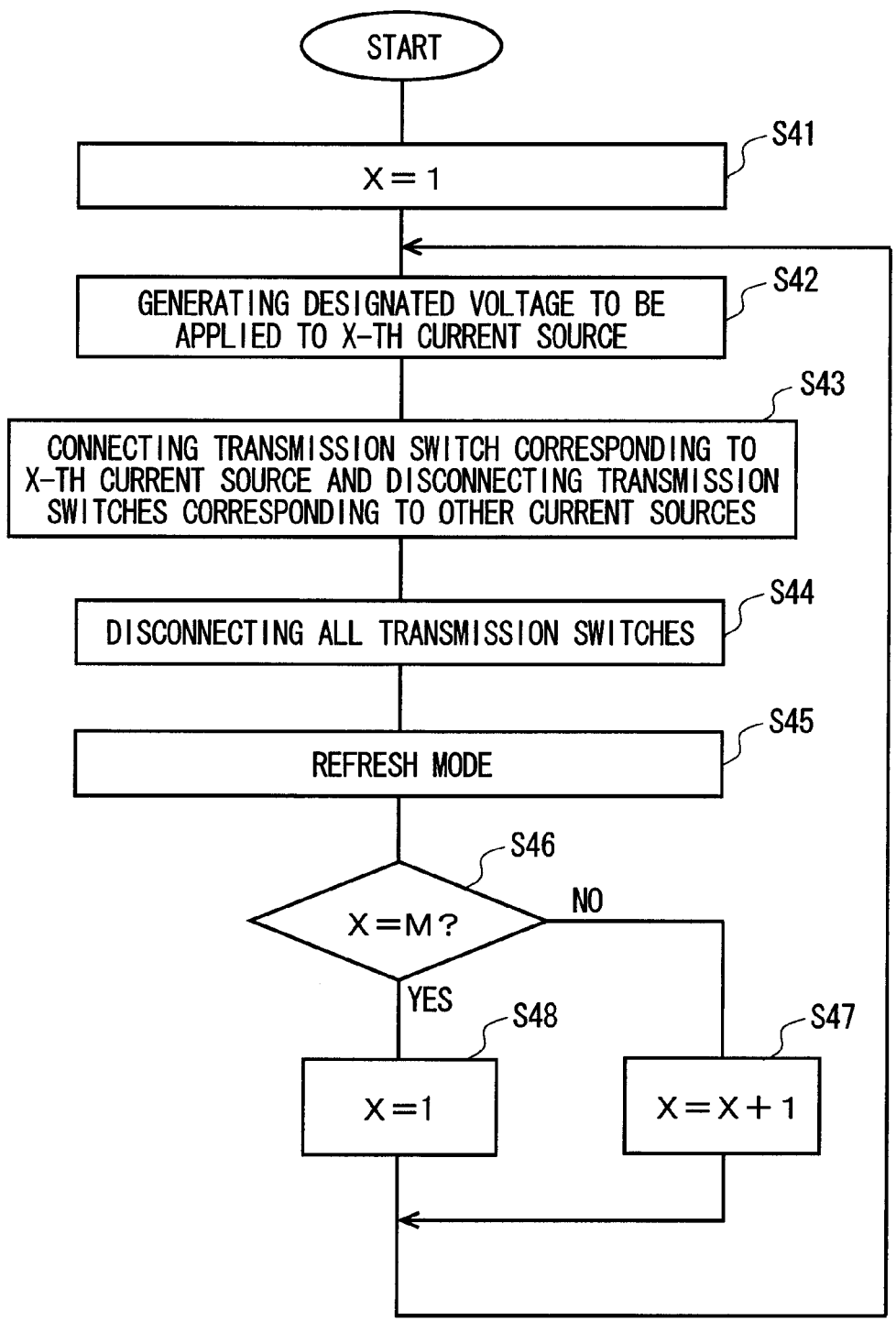
FIG. 9 is a flow chart showing a process performed by the control section 40 when charging a plurality of holding sections 24 with the designated voltage, according to the present embodiment.

FIG. 9 is a flow chart showing a process performed by the control section 40 when charging a plurality of holding sections 24 with the designated voltage, according to the present embodiment. In this example, the DA conversion apparatus 10 includes M current sources 22, where M is an integer greater than 1, and the control section 40 charges each of M holding sections 24 corresponding to the M current sources 22 with a different designated voltage.

First, the control section 40 substitutes 1 for the variable X for identifying the current source 22 to be selected (S41). As a result, the control section 40 selects a first current source 22 from among the M current sources 22 in the first step of this process flow.

Next, the control section 40 generates the designated voltage to be applied to the X-th current source 22 from the voltage generating end 50 of the setting DAC 30 (S42). The control section 40 then connects the transmission switch 42 corresponding to the X-th current source 22, and disconnects the transmission switches 42 corresponding to current sources 22 other than the X-th current source 22 (S43). In this way, the control section 40 can charge the corresponding holding section 24 with the voltage of the voltage generating end 50 of the setting DAC 30. At this time, one of the voltage of the setting DAC 30 of the voltage generating end 50 and the voltage of the holding section 24 is increased and the other is decreased, such that these voltages approach each other.

Next, after a predetermined time has passed, e.g. enough time for the charge to be transferred, the control section 40 disconnects all of the transmission switches 42 (S44). The control section 40 then sets the setting DAC 30 to the refresh mode (S45).

Next, the control section 40 judges whether X=M (S46). If X does not equal M (the "NO" of S46), the control section 40 adds 1 to X (S47). The control section 40 then returns to step S42 and repeats the process from step S42. In this way, the control section 40 can sequentially select one of the M current sources 22 at a time and charge the selected current sources 22 in order with the corresponding designated voltage.

If X=M (the "YES" of S46), the control section 40 substitutes 1 for X (S48). The control section 40 then returns the process to step S42 and repeats the subsequent steps. In this way, the control section 40 can sequentially select current sources 22 and charge each of the holding sections 24 with the corresponding designated voltage.

As described above, the control section 40 sequentially selects one current source 22 at a time and causes the setting DAC 30 to, at least once, generate the designated voltage corresponding to the selected current source 22. With the setting DAC 30 having generated the designated voltage corresponding to the selected current source 22, the control section 40 connects the transmission switch 42 corresponding to the selected current source 22. As a result, the control section 40 can cause the voltages of the holding sections 24 to gradually approach, in parallel, the respective designated voltages.

The control section 40 may repeat the process from step S42 to step S48 during the current output operation. In this way, the control section 40 can replenish the charge that is discharged from the holding sections 24 during the current output operation. In this case, the control section 40 may include a wait time after step S48 that corresponds to the droop of the corresponding holding section 24.

Figure 10:
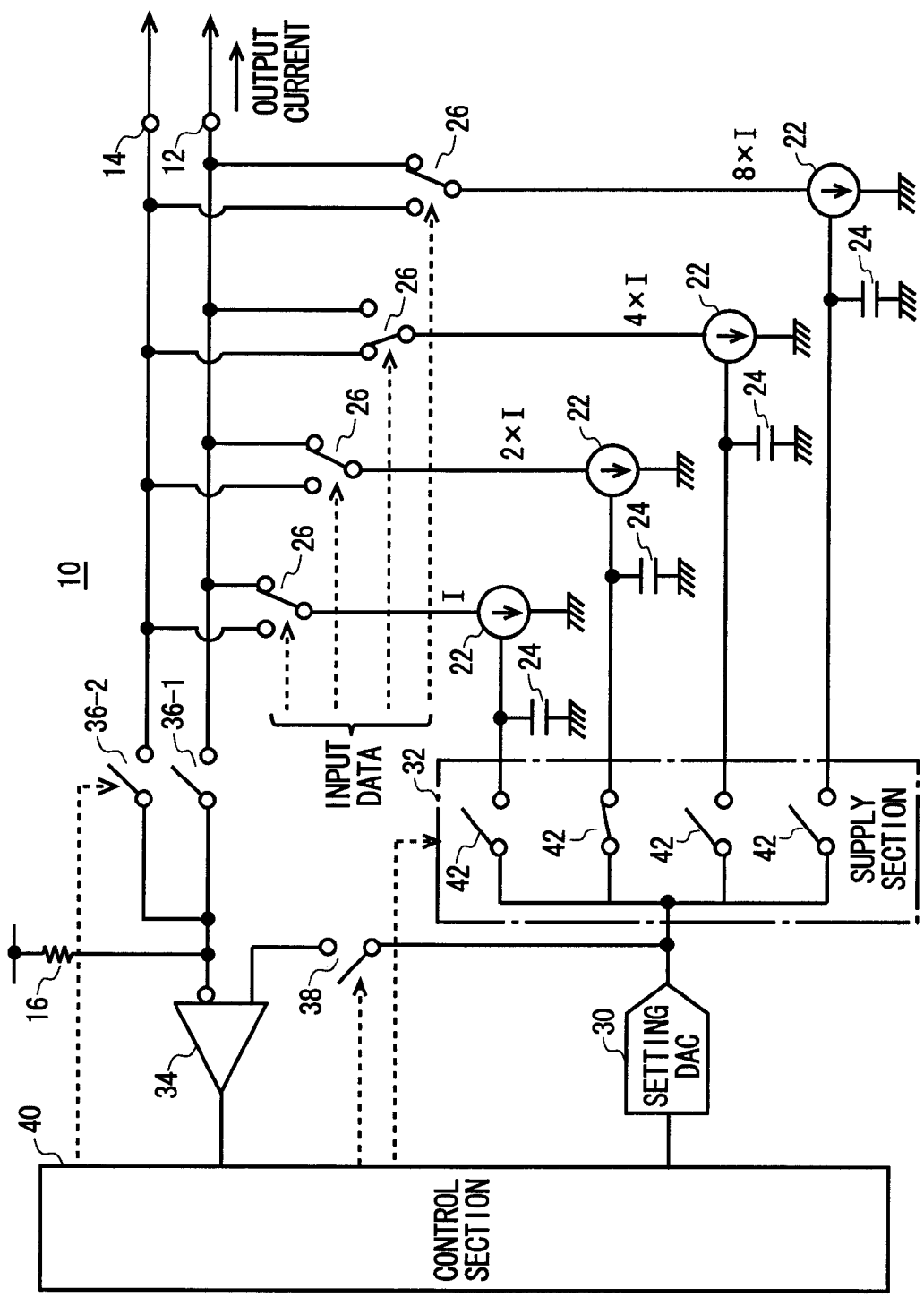
FIG. 10 shows a configuration of the DA conversion apparatus 10 according to a first modification of the present embodiment.

FIG. 10 shows a configuration of the DA conversion apparatus 10 according to a first modification of the present embodiment. The DA conversion apparatus 10 according to the present modification adopts the same function and configuration as the DA conversion apparatus 10 of FIG. 1, and therefore components having the same function and configuration as those of FIG. 1 are given the same reference numerals and redundant explanations are omitted.

The DA conversion apparatus 10 of the present modification is provided with a first measurement switch 36-1 and a second switching section 26-2, instead of the measurement switch 36. The DA conversion apparatus 10 of the present modification houses the first resistor 16 therein.

The first measurement switch 36-1 provides a connection and a disconnect between the first output end 12 and the one input end of the comparator 34. The second measurement switch 36-2 provides a connection and a disconnect between the second output end 14 and the one input end of the comparator 34.

During calibration, the control section 40 connects the first measurement switch 36-1 and disconnects the second measurement switch 36-2 when measuring the voltage of the first output end 12. Furthermore, during calibration, the control section 40 disconnects the first measurement switch 36-1 and connects the second measurement switch 36-2 when measuring the voltage of the second output end 14. In this way, during calibration, the DA conversion apparatus 10 of the present modification can measure the voltage of the first output end 12 or the second output end 14.

Furthermore, in the present modification, the first resistor 16 is provided between a standard voltage and the one input end of the comparator 34, which is the input end to which the first output end 12 or the second output end 14 is connected. As a result, even when a connection is made for the DA conversion apparatus 10 to supply direct current to the load, i.e. when the resistor is not connected between the standard potential and the first output end 12 or the second output end 14, the DA conversion apparatus 10 can measure the voltage corresponding to the current flowing through a current source 22.

Figure 11:
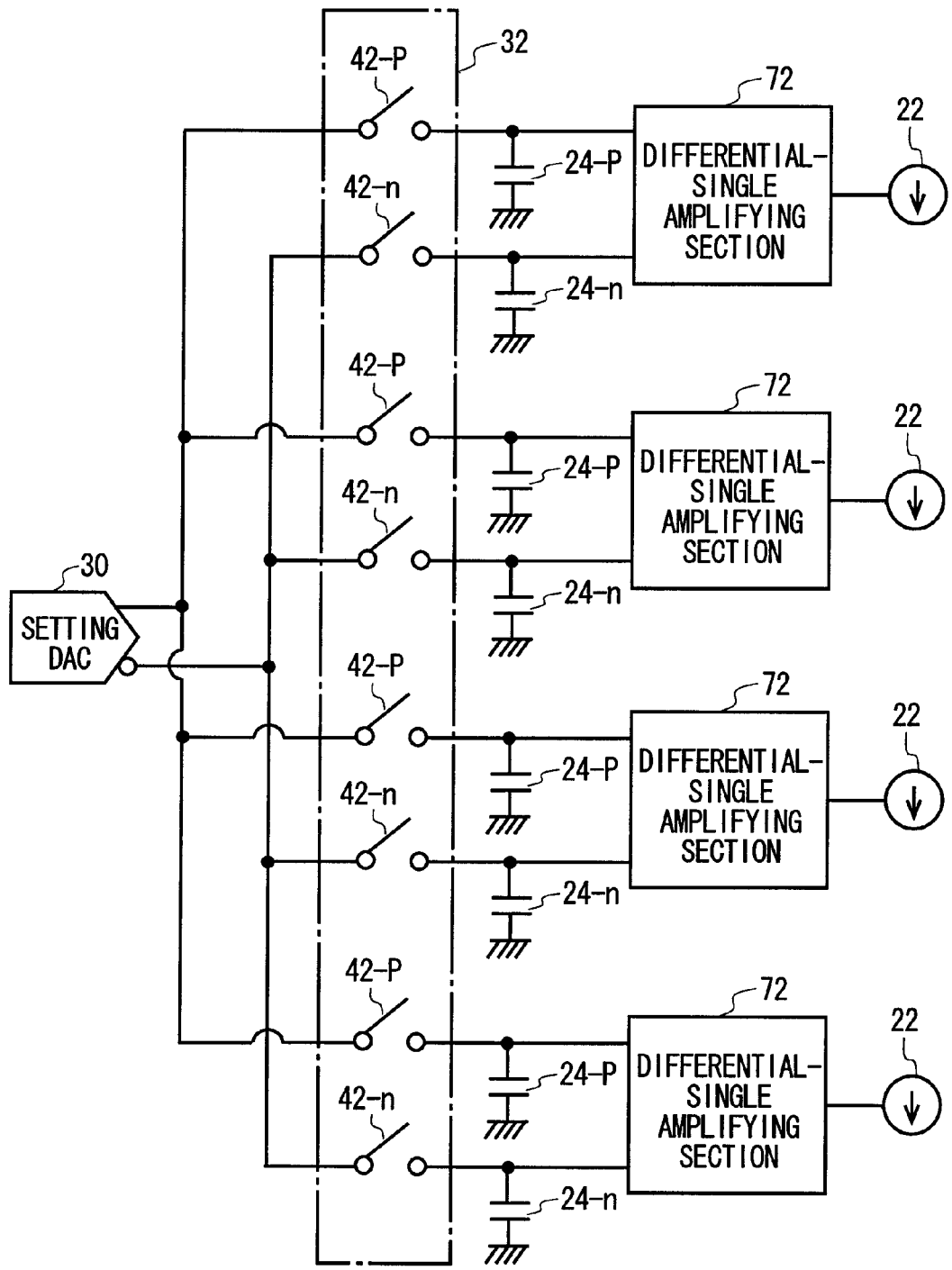
FIG. 11 shows a portion of a configuration of a DA conversion apparatus 10 according to a second modification of the present embodiment.

FIG. 11 shows a portion of a configuration of a DA conversion apparatus 10 according to a second modification of the present embodiment. The DA conversion apparatus 10 of the present modification adopts the same function and configuration as the DA conversion apparatus 10 of FIG. 1, and therefore components having the same function and configuration as those of FIG. 1 are given the same reference numerals and redundant explanations are omitted.

The DA conversion apparatus 10 of the present modification further includes a plurality of differential-single amplifying sections 72. The differential-single amplifying sections 72 are provided to correspond to the current sources 22. Each differential-single amplifying section 72 receives a differential voltage as input and supplies a single-end voltage corresponding to the input differential voltage to the current setting end of the corresponding current source 22.

The setting DAC 30 in the present modification generates a differential designated voltage. The supply section 32 in the present modification switches supply of the differential designated voltage generated by the setting DAC 30 among the plurality of differential-single amplifying sections 72.

For example, the supply section 32 may include a plurality of positive transmission switches 42-p and a plurality of negative transmission switches 42-n corresponding respectively to the plurality of current sources 22. The positive transmission switches 42-p each provide a connection and a disconnect between a positive voltage generating end of the setting DAC 30 and a positive input end of the corresponding differential-single amplifying section 72. The negative transmission switches 42-n each provide a connection and a disconnect between a negative voltage generating end of the setting DAC 30 and a negative input end of the corresponding differential-single amplifying section 72.

In the present modification, the DA conversion apparatus 10 includes a plurality of positive holding sections 24-p and a plurality of negative holding sections 24-n corresponding to the current sources 22. Each positive holding section 24-p is provided between the positive input end of the corresponding differential-single amplifying section 72 and the standard potential, e.g. a ground. Each negative holding section 24-n is provided between the negative input end of the corresponding differential-single amplifying section 72 and the standard potential, e.g. the ground.

The DA conversion apparatus 10 of the present modification can generate a differential designated voltage from the setting DAC 30. As a result, the DA conversion apparatus 10 of the present modification can decrease the noise that is applied when supplying the designated voltage from the setting DAC 30 to the holding sections 24.

Figure 12:
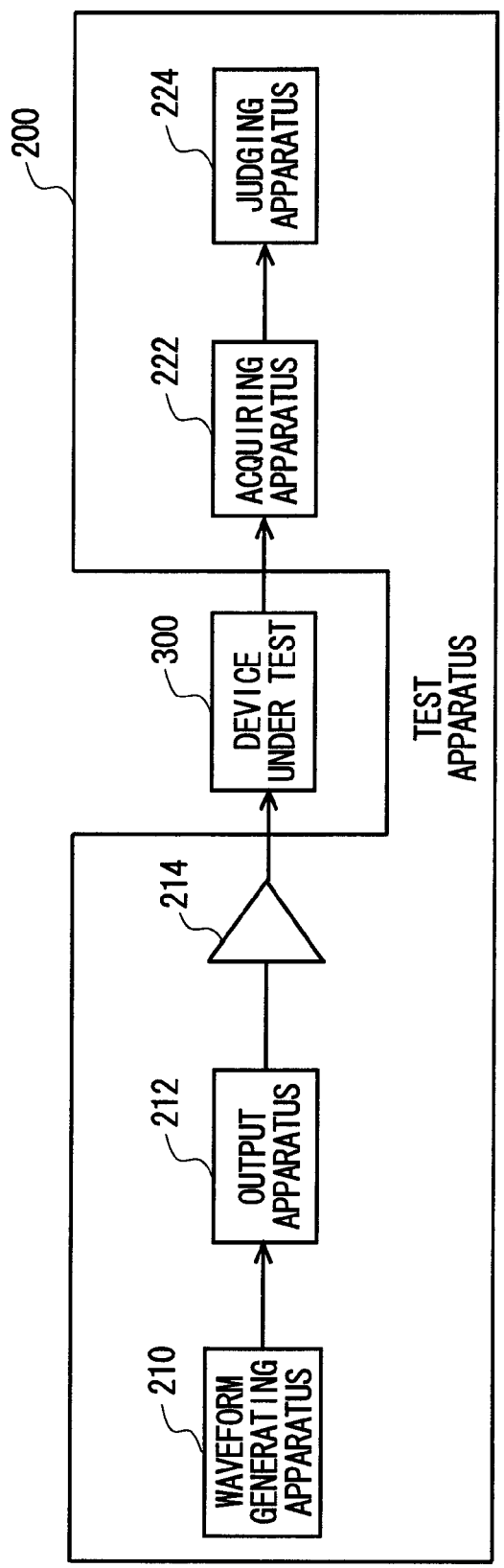
FIG. 12 shows a configuration of a test apparatus 200 according to an embodiment of the present invention, along with a device under test 300.

FIG. 12 shows a configuration of a test apparatus 200 according to an embodiment of the present invention, along with a device under test 300. The test apparatus 200 tests the device under test 300, which is a semiconductor device or the like.

The test apparatus 200 includes a waveform generating apparatus 210, an output apparatus 212, a drive apparatus 214, an acquiring apparatus 222, and a judging apparatus 224. The waveform generating apparatus 210 generates waveform data representing a test signal so be supplied to the device under test 300. The output apparatus 212 outputs a current corresponding to the waveform data generated by the waveform generating apparatus 210. The output apparatus 212 has the same configuration as the DA conversion apparatus 10 described in any of FIGS. 1 to 11, and therefore redundant descriptions are omitted.

The drive apparatus 214 outputs a test signal having a voltage corresponding to current output by the output apparatus 212. The drive apparatus 214 supplies the device under test 300 with the output test signal.

The acquiring apparatus 222 acquires a response signal that is output in response to the test signal. The acquiring apparatus 222 may measure the waveform of the response signal or may acquire the logic value of the response signal. The judging apparatus 224 judges acceptability of the device under test 300 based on the response signal acquired by the acquiring apparatus 222.

This test apparatus 200 can output an accurate current with a quick response from the output apparatus 212, and can therefore accurately test the device under test 300 with a high-speed test signal. Furthermore, in this test apparatus 200, the output apparatus 212 has a small structure and a low overall manufacturing cost.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An output apparatus comprising:
a plurality of current sources;
a plurality of holding sections that correspond respectively to the current sources and that each hold a designated voltage that designates a current flowing through the corresponding current source;
a setting DAC that sequentially generates the designated voltage to be held by each holding section; and
a supply section that sequentially switches a supply of the designated voltage generated by the setting DAC among corresponding holding sections, wherein
the current sources are the same circuits as each other and are respectively supplied with designated voltages that differ according to powers of 2.

2. An output apparatus comprising:
a plurality of current sources;
a plurality of holding sections that correspond respectively to the current sources and that each hold a designated voltage that designates a current flowing through the corresponding current source;
a setting DAC that sequentially generates the designated voltage to be held by each holding section; and
a supply section that sequentially switches a supply of the designated voltage generated by the setting DAC among corresponding holding sections, wherein
the output apparatus is a DA conversion apparatus that causes a current corresponding to input data received from outside to flow to an output end, and
the output apparatus further comprises a plurality of switching sections that correspond respectively to the current sources and that each switch whether the current flowing through the corresponding current source flows to the output end, according to the input data.

3. The output apparatus according to claim 2, wherein
each holding section is a capacitor provided between a current setting end of the corresponding current source and a standard potential, and
the supply section includes a plurality of transmission switches that correspond respectively to the current sources and that each provide a connection and a disconnect between a voltage generating end of the setting DAC and the current setting end of the corresponding current source.

4. The output apparatus according to claim 3, further comprising
a control section that repeatedly connects and disconnects a transmission switch corresponding to a selected current source to charge the holding section corresponding to the selected current source with the designated voltage output by the setting DAC for designating the current flowing through the selected current source, such that voltage of the holding section corresponding to the selected current source sequentially approaches the designated voltage.

5. The output apparatus according to claim 4, wherein
the control section disconnects transmission switches corresponding to current sources that are not selected.

6. The output apparatus according to claim 4, wherein
the setting DAC is a charge redistribution DAC.

7. The output apparatus according to claim 6, wherein
the setting DAC includes:
a capacitor array connected to the voltage generating end;
a DAC internal switching section that switches connections in the capacitor array; and
a controller,
during a refresh mode, the controller charges the capacitor array with a reference potential, and
during an output mode, which is after the refresh mode, the controller switches a ratio between (i) a capacitance between a common potential and the voltage generating end in the capacitor array and (ii) a capacitance between the reference potential and the voltage generating end in the capacitor array, according to input data received from outside, and generates the designated voltage corresponding to the input data from the voltage generating end.

8. A test apparatus that tests a device under test, comprising:
a waveform generating apparatus that generates waveform data representing a waveform of a signal to be applied to the device under test;
the output apparatus according to claim 2 that outputs a current corresponding to the waveform data; and
a drive apparatus that applies, to the device under test, a voltage corresponding to the current output from the output apparatus.

9. An output apparatus comprising:
a plurality of current sources;
a plurality of holding sections that correspond respectively to the current sources and that each hold a designated voltage that designates a current flowing through the corresponding current source;
a setting DAC that sequentially generates the designated voltage to be held by each holding section;

a supply section that sequentially switches a supply of the designated voltage generated by the setting DAC among corresponding holding sections; and a plurality of amplifying section that correspond respectively to the current sources and that each receive a differential voltage as input and supply a current setting end of the corresponding current source with a single-end voltage corresponding to the input differential voltage, wherein the setting DAC generates a differential designated voltage, and the holding sections correspond respectively to positive input ends and negative input ends of the amplifying sections.

10. An output apparatus comprising:

a plurality of current sources;

a plurality of holding sections that correspond respectively to the current sources and that each hold a designated voltage that designates a current flowing through the corresponding current source;

a setting DAC that sequentially generates the designated voltage to be held by each holding section;

a supply section that sequentially switches a supply of the designated voltage generated by the setting DAC among corresponding holding sections; and a control section that adjusts the designated voltage supplied to each holding section by the setting DAC, based on a result of a comparison between a voltage generated by the setting DAC and a voltage corresponding to the current flowing through the corresponding current source.

11. The output apparatus according to claim 10, further comprising a resistor provided between an output end and a standard potential.

12. The output apparatus according to claim 11, further comprising a comparator that compares an amount of voltage generated by the setting DAC and an amount of voltage of the output end.

13. The output apparatus according to claim 12, further comprising a measurement switch that is provided between one input end of the comparator and the output end and that is connected during calibration and disconnected during a current output operation, wherein the resistor is provided between the one input end of the comparator and the standard potential.

14. The output apparatus according to claim 13, wherein the control section measures the voltage of the output end according to a sequential comparison process performed using the comparator and the setting DAC, and adjusts the designated voltage supplied to a current source under adjustment, from among the plurality of current sources, to cause the current flowing through the current source under adjustment to be a target value, based on the measurement result of the voltage of the output end.

15. The output apparatus according to claim 14, wherein before the current output operation, during which a current corresponding to input data received from outside is caused to flow to the output end, the control section measures the voltage of the output end.

16. The output apparatus according to claim 14, wherein during the current output operation, during which a current corresponding to input data received from outside is caused to flow to the output end, the control section measures the voltage of the output end at a timing at which current of only one current source flows through the output end.

* * * * *